United States Patent [19]
Hammann, IV et al.

[11] Patent Number: 5,122,432
[45] Date of Patent: Jun. 16, 1992

[54] PHOTOSENSITIVE MICROCAPSULE IMAGING SYSTEM HAVING IMPROVED GRAY SCALE

[75] Inventors: William A. Hammann, IV, Miamisburg; Peter Gottchalk, Centerville; James A. Dowler, Franklin, both of Ohio

[73] Assignee: The Mead Corporation, Dayton, Ohio

[21] Appl. No.: 627,170

[22] Filed: Dec. 14, 1990

[51] Int. Cl.⁵ .................................................. G03C 1/72
[52] U.S. Cl. .................................. 430/138; 430/507; 430/512; 430/517; 430/935
[58] Field of Search ............... 430/138, 507, 512, 517, 430/935; 427/407.1, 414

[56] References Cited

U.S. PATENT DOCUMENTS

| | | | |
|---|---|---|---|
| 4,576,891 | 3/1986 | Adair et al. | 430/512 |
| 4,842,977 | 6/1989 | Kakimi | 430/138 |
| 4,868,087 | 9/1989 | Yamamoto | 430/138 |
| 4,897,335 | 1/1990 | Kakimi | 430/138 |
| 4,927,731 | 5/1990 | Takahashi | 430/138 |
| 4,929,530 | 5/1990 | Saeki et al. | 430/138 |
| 4,971,941 | 11/1990 | Dowler et al. | 430/138 |

*Primary Examiner*—Hoa Van Le
*Attorney, Agent, or Firm*—Thompson, Hine and Flory

[57] ABSTRACT

A photosensitive material includes a support having microcapsules and a color correction dye on its surface. The microcapsules include first, second and third sets of microcapsules, each set containing an internal phase. The first set of microcapsules is sensitive to red light and is associated with a cyan image-forming agent, the second set of microcapsules is sensitive to green light and is associated with a magenta image-forming agent, and the third set of microcapsules is sensitive to blue light and is associated with a yellow image-forming agent. The cyan, magenta and yellow image forming agents are respectively soluble in the internal phases of the first, second and third sets of microcapsules whereas the color correction dye is insoluble in the internal phase. The first, second and third sets of microcapsules are present in one or more layers containing a binder on the surface of the support. The color correction dye absorbs at least one of red, green, and blue light. The color correction dye is present in the binder of the one or more layers of microcapsules or is present in a separate layer containing a binder such that the film speed of at least one of the first, second and third sets of microcapsules is reduced and thereby the photosensitive material exhibits improved gray scale.

20 Claims, 3 Drawing Sheets

PHOTOSENSITIVE MICROCAPSULE IMAGING SYSTEM HAVING IMPROVED GRAY SCALE

BACKGROUND OF THE INVENTION

The present invention relates to a panchromatic microcapsule imaging system which is useful in forming full color images using the imaging processes described in U.S. Pat. Nos. 4,399,209 and 4,440,846 to The Mead Corporation. More particularly, the present invention relates to a panchromatic imaging material employing one or more layers of photosensitive microcapsules and a color correction dye. The microcapsules include three or more sets of microcapsules for different colors whereas the color correction dye absorbs light of a certain wavelength band to which at least one of the different sets of microcapsules is sensitive. The color correction dye is incorporated in a binder present in the one or more layers of microcapsules or in a separate layer, thereby reducing the film speed of at least one of the different sets of microcapsules such that the imaging material exhibits improved gray scale.

U.S. Pat. No. 4,842,976 to The Mead Corporation describes a photosensitive material useful in full color and panchromatic imaging, comprising a support having on its surface a layer of microcapsules. The microcapsules individually contain cyan, magenta and yellow color formers and photosensitive compositions having distinctly different sensitivities in a visible region. More particularly, the photosensitive composition encapsulated with the cyan color former is sensitive to red light, the photosensitive composition encapsulated with the magenta color former is sensitive to green light, and the photosensitive composition encapsulated with the yellow color former is sensitive to blue light. A uniform mixture of the microcapsules is distributed over the surface of the support. The photosensitive material is image-wise exposed to visible light, and thereafter, it is subjected to a uniform rupturing force, such as pressure, which causes the microcapsules in the underexposed and unexposed areas to rupture and release the color formers. The color formers then react with a developer material which is present on the same support or on a different support and produces a full color image.

Distinctively different sensitivities of photosensitive microcapsules are principally enabled by encapsulating with the color formers different photoinitiators as respective constituents of the photosensitive compositions. However, these different photoinitiators often induce difference in film speed between microcapsules for different colors. This difference can be a critical drawback, particularly, in panchromatic imaging since it can result in images with poor gray scale. To compensate difference in film speed and to thereby form images with good gray scale, optical filters must be used upon exposure. Alternatively, it is necessary to separate the red, green blue components of the original, and the intensity of or exposure time for each component must be adjusted in accordance with the film speed of microcapsules for the complementary color.

Addition of radiation absorbers or dyes to adjust photographic properties of an imaging system is known in the art.

U.S. Pat. No. 4,840,866 to the Mead Corporation discloses a microcapsule imaging system which employs a radiation absorber. In this system, the radiation absorber is incorporated i the internal phase of at least one of two sets of microcapsules for the same color to control gamma and dynamic range. Control of these photographic properties is possible using this technique during preparation of microcapsules.

U.S. Pat. No. 4,576,891 to the Mead Corporation discloses a full color and panchromatic microcapsule imaging system which utilizes a dye. According to this patent, the dye can be contained, to prevent cross-talk between microcapsules for different colors, in a binder for microcapsules, in the internal phase of microcapsules or in the walls of microcapsules.

SUMMARY OF THE INVENTION

In accordance with the present invention, a panchromatic imaging system which can exhibit improved gray scale is obtained by incorporating a color correction dye (a visible light absorber) in the binder of one or more layers of light-sensitive microcapsules or in a separate layer such that the film speed of microcapsules for at least one color is reduced and thereby the quantity of difference in film speed between different color microcapsules is reduced. This invention is useful in three-color system and in four-color systems. According to the present invention, a color correction dye is selected which has a spectral absorption characteristic such that the color correction dye absorbs light within the spectral sensitivity range of microcapsules whose film speed is faster than that of other microcapsules. For example, where the film speed of magenta microcapsules is faster than cyan and yellow microcapsules, a color correction dye is selected which has an absorption spectrum within the spectral sensitivity range of the magenta microcapsules. One of the advantages of the present invention is that selection and incorporation of such a color correction dye can be achieved after all the microcapsules necessary for full color imaging and prepared or even after microcapsules are coated on a substrate to form the microcapsule layer(s). Thus, the color balance is adjusted without modifying the internal phase of the microcapsules.

Accordingly, one manifestation of the present invention resides in a photosensitive material comprising a support which has on a surface thereof microcapsules and a color correction dye. The microcapsules include first, second and third sets of microcapsules. The first set of microcapsules is sensitive to red light and is associated with a cyan image-forming agent. The second set of microcapsules is sensitive to green light and is associated with a magenta image-forming agent. The third set of microcapsules is sensitive to blue light and is associated with a yellow image-forming agent. The cyan, magenta and yellow image-forming agents are soluble in the internal phase of the microcapsules whereas the color correction dye is insoluble in the internal phase. The different sets of microcapsules can be present in one or more layers on the surface of the support. This layer or each of the layers contains a binder. The color correction dye is capable of absorbing at least one of red, green, or blue light. The color correction dye is present in the binder of at least one of the one or more layers of microcapsules or in a separate layer such that the film speed of at least one of the first, second and third sets of microcapsules is reduced and thereby the photosensitive material exhibit improved gray scale. More particularly, where the first, second and third sets of microcapsules are present in one layer, the color correction dye can be contained in the binder of the one layer or in the separate layer which is coated on the one layer of microcapsules. Where the first, second and third sets of microcapsules are present in two or more layers, the color correction dye can be contained in the binder of at least one of the layers, in the separate layer which, preferably, is interposed between two of the microcapsule layers, or in both the separate layer and the binder of at least one of the microcapsule layers.

Another manifestation of the present invention resides in a method of controlling the film speed of a photosensitive material which employs a support having microcapsules on its surface. The microcapsules of the photosensitive material include first, second and third sets of microcapsules. The first set of microcapsules is sensitive to red light and is associated with a cyan image-forming agent. The second set of microcapsules is sensitive to green light and is associated with magenta image-forming agent. The third set of microcapsules is sensitive to blue light and is associated with a yellow image-forming agent. The cyan, magenta and yellow image-forming agents are soluble in the internal phase of the microcapsules. The first, second and third sets of microcapsules are present in one or more layers on the surface of the support. The method in accordance with the present invention comprises preparing one or more coating compositions in which the first, second and third sets of microcapsules are dispersed, adding a color correction dye to at least one of the one or more coating compositions or a separate coating composition, and applying the one or more coating compositions to the support to form the one or more layers of microcapsules. A proper color correction dye for use in this method is a dye which is insoluble in the internal phase of the microcapsules and can absorb at least one of red, green, and blue light. Such a dye is added in an amount such that the film speed of at least one of the first, second and third sets of microcapsules is reduced to allow the photosensitive material to exhibit improved gray scale. By being insoluble in the internal phase, any transfer of the color correction dye by the internal phase is reduced.

DEFINITION

The term "spectral sensitivity range" as herein used refers to the spectral region in which a photosensitive composition or microcapsule responds to light.

The term "broad band white light" as used herein refers to energy at wavelength of visible light.

The term "reduce the film speed" or "decrease the toe (or shoulder) speed" as herein used refers to increasing the amount of energy required to expose the microcapsules.

The term "increase the shoulder speed" as herein used refers to decreasing the amount of energy required to expose the microcapsules.

DETAILED DESCRIPTION OF THE INVENTION

The present invention is useful to control the film speed of photosensitive microcapsules and is thereby useful to enhance gray scale in microcapsule imaging, particularly, in full color and panchromatic imaging.

Full color and panchromatic imaging systems are described in U.S. Pat. Nos. 4,399,209; 4,440,846; and 4,842,796. These systems can be modified in accordance with the present invention to include a color correction dye to control the film speed of microcapsules and to thereby improve gray scale. As explained in the aforementioned references, these systems are preferably single exposure systems which employ three sets of microcapsules, namely, a set of cyan microcapsules, a set of magenta microcapsules, and a set of yellow microcapsules. The cyan microcapsules contain a cyan color precursor and a first photosensitive composition. The magenta microcapsules contain a magenta color precursor and a second photosensitive composition. The yellow microcapsules contain a yellow color precursor and a third photosensitive composition. Each of first, second and third photosensitive compositions is primarily sensitive in a different wavelength band such that the three sets of microcapsules can be individually exposed with minimum cross-talk. More specifically, the cyan, magenta and yellow microcapsules are respectively sensitive to red, green, and blue light.

Figure 1:
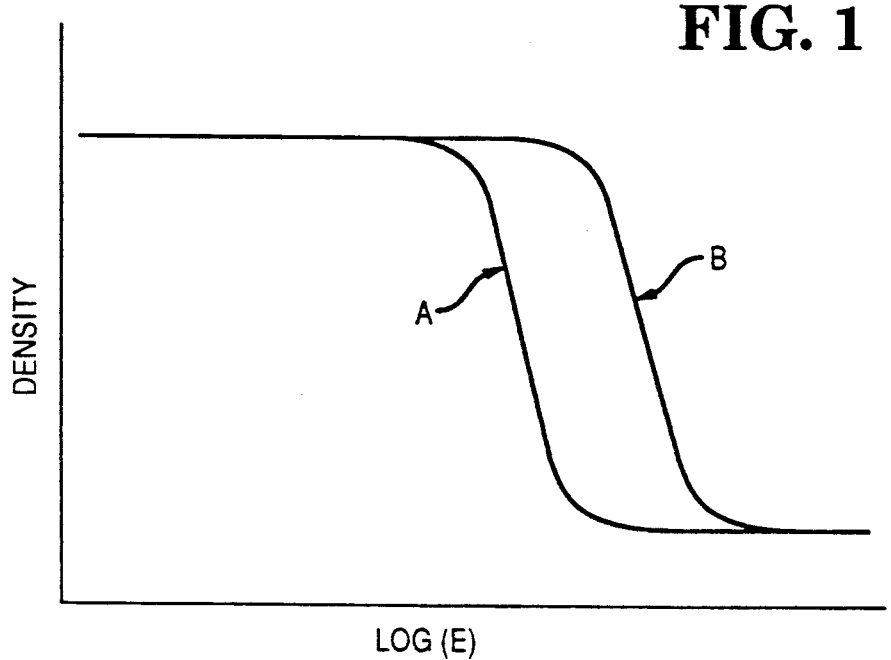
FIG. 1 illustrates a H and D curve (A) for a hypothetical set of microcapsules and another H and D curve (B) for the same set of microcapsules with color correction dye associated with the microcapsules in accordance with the present invention.

In designing full color, single exposure imaging systems, it is critical that the three sets of microcapsules have similar film speeds. For example, the H and D curves should be as nearly identical as possible. Otherwise, the imaging process using the imaging system will require means, such as optical filters, for adjusting the intensity of light source to provide good gray scale or good color reproduction. In accordance with the present invention, the three sets of microcapsules are distributed over a support or substrate to form one or more layers, and a color correction dye is incorporated in at least one of the one or more layers of microcapsules or a separate layer containing a binder. More particularly, each of the one or more layers of microcapsules contains a binder, and the color correction dye is present in the binder of the one or more layers or in the separate layer. The incorporated color correction dye is a dye which can absorb light within the spectral sensitivity range of at least one of the three sets of microcapsules, of which the film speed(s) is faster than that of the other set(s). Such a dye is incorporated in an amount which reduces the film speed(s) of the faster set(s) of microcapsules so that better gray scale is exhibited by the imaging system. This is illustrated in FIG. 1 wherein Curve A is an H and D curve for an imaging sheet prepared using a faster set of microcapsules without a color correction dye, and Curve B is an H and D curve for an imaging sheet prepared using the same set of microcapsules and a color correction dye which is capable of absorbing light within a spectral sensitivity range of that set of microcapsules.

Preferably, the amount of the color correction dye added is such that the film speed(s) of the faster set(s) of microcapsules approaches or more closely approximates the film speed(s) of the other slower set(s) of microcapsules. For example, where curve A in FIG. 1 represents the H and D curve of magenta microcapsules whose film speed is faster than that of cyan and yellow microcapsules, Curve B can be modified similar to the H and D curves for the cyan and yellow microcapsules.

In addition, in order to further modify or finely adjust the H and D curves, particularly, the shoulder and toe speeds, photoinitiators and polymerization inhibitors can be utilized. For example, where magenta microcapsules of a modified film speed (Curve B in FIG. 1) are slightly slower in shoulder speed than cyan and yellow microcapsules, a photoinitiator can be added to the internal phase of the magenta microcapsules to increase the shoulder speed. This can typically be achieved by increasing the amount of a photoinitiator used in the photosensitive composition in the microcapsules whose shoulder speed is intended to be increased. While, where magenta microcapsules are slightly faster in toe speed than cyan and yellow microcapsules, a polymerization inhibitor can be added to the internal phase of the magenta microcapsules in order to decrease the toe speed without decreasing the shoulder speed. Another method to increase the shoulder speed of the microcapsules is selective bump exposure as taught in U.S. Pat. No. 4,482,624.

While it is difficult to match the H and D curves exactly, gray scale is optimized by approximating the H and D curves for the three sets of microcapsules as closely as possible or even by slightly shifting the H and D curve(s) of one or two faster sets of microcapsules toward the H and D curve(s) of the other slower set(s) of microcapsules. In comparing and approximating the H and D curves for the three sets of microcapsules, it is important that those H and D curves are the ones exhibited upon exposing the three sets of microcapsules to a light source which generates broad band white light.

Persons skilled in the art will appreciate that the color correction dye can, alternatively, be incorporated in the microcapsule wall to control the film speed of the microcapsules in a similar manner to that of the present invention. Persons skilled in the art will also appreciate that the present invention described above can also reduce cross-talk between the different sets of microcapsules. Imaging systems and methods for preventing cross-talk is described in U.S. Pat. No. 4,576,891 to The Mead Corporation, which is hereby incorporated by reference.

In a preferred embodiment, the mixture of three sets of microcapsules are homogeneously distributed on a substrate to form a microcapsule layer containing a binder. One or more color correction dyes are incorporated in the binder of the microcapsule layer. The color correction dye or dyes have an absorption spectrum or spectrums within the spectral sensitivity range or ranges of one or two of the three sets of microcapsules. The dye or dyes absorb light intended for exposing the faster microcapsules and shield them from the light. This reduces the film speed of the faster microcapsules. If the color correction dye or dyes are in the binder of microcapsule layer or layers, it is important that the binder covers the microcapsules so that the dye or dyes have a satisfactory shielding effect. Instead of being in the microcapsule layer, the color correction dye(s) can be present in a separate layer coated over the microcapsule layer.

Figure 2:
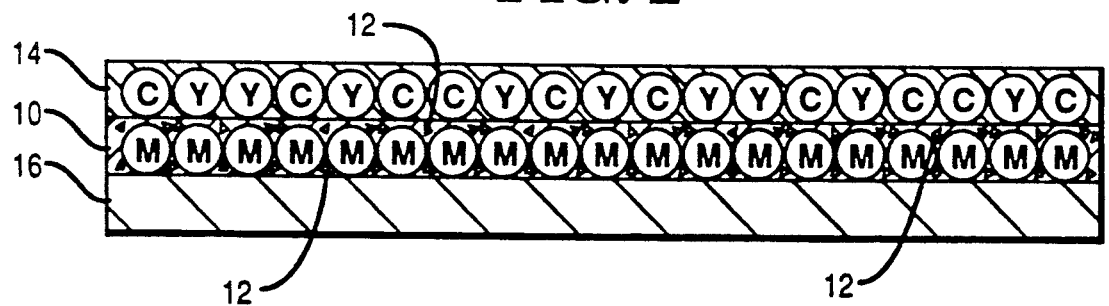
FIG. 2 is a schematic cross-sectional view of an imaging material according to an embodiment of the present invention.

In another embodiment, three sets of microcapsules are provided in the form of at least two binder-containing layers on a substrate, and one or more color correction dyes are present in the binder of at least one of the microcapsule layers. FIG. 2 shows an example of an imaging sheet in accordance with this embodiment, wherein a set of magenta microcapsules (M), the fastest set of the three sets of microcapsules, is formed into a first layer 10 containing a color correction dye 12 which can absorb light within the spectral sensitivity range of magenta microcapsules (M), and the other sets of microcapsules, i.e., sets of cyan and yellow microcapsules (C and Y) are formed into a second layer 14 coated over the first layer 10. Reference numeral 16 designates a substrate on which the first and second layers 10 and 14 are provided.

Persons skilled in the art will understand that many other arrangements which are suitable for enhancing gray scale are also possible in which, for example, three sets of microcapsules are respectively formed into different layers, and two different color correction dyes which absorbs light in different wavelength bands are incorporated in two or more layers.

Figure 3:
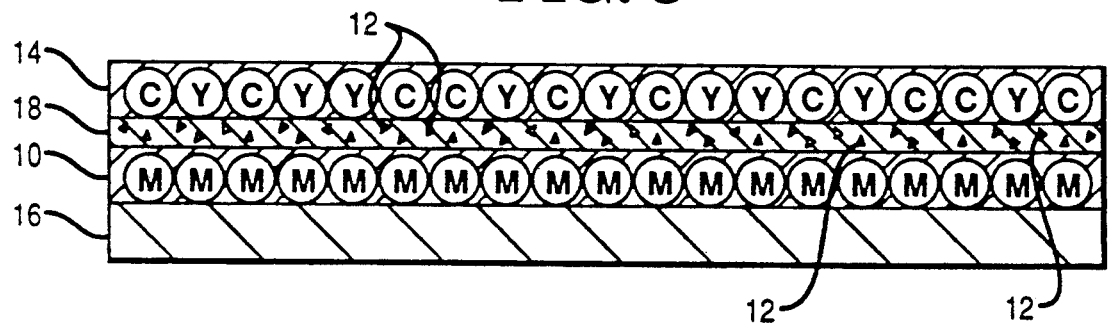
FIG. 3 is a schematic cross-sectional view of an imaging material in accordance with another embodiment of the present invention.
Figure 4:
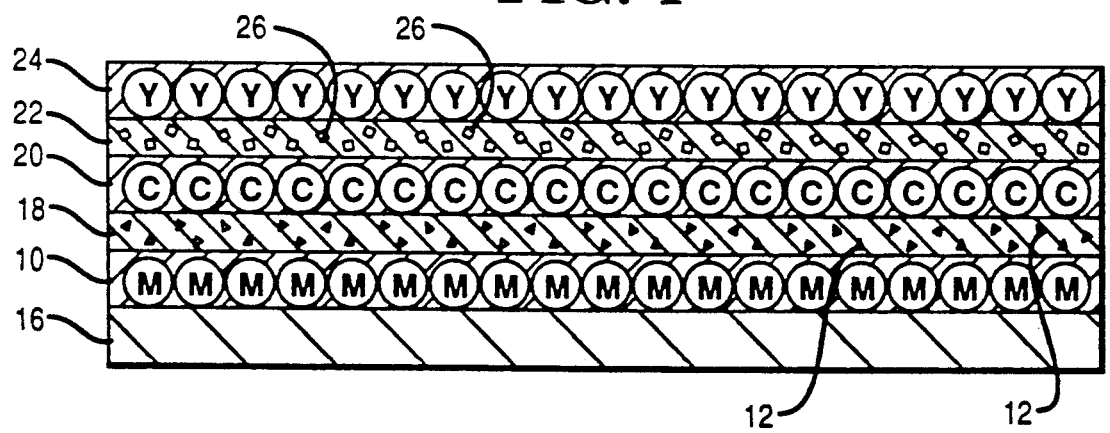
FIG. 4 is a schematic cross-sectional view of an imaging material in accordance with a further embodiment of the present invention.

In a still another embodiment, three sets of microcapsules are present in at least two layers on a substrate, and one or more color correction dyes are incorporated in one or more separate layers on the same substrate. Examples of imaging sheets according to this embodiment are illustrated in FIGS. 3 and 4. In FIG. 3, a separate layer 18 is interposed between a first layer 10 including magenta microcapsules (M) and a second layer 14 including cyan and yellow microcapsules (C and Y), and a color correction dye 12 which can absorb green light is incorporated in the separate layer 18. In FIG. 4, a separate layer 18 is interposed between a first layer 10 including magenta microcapsules (M) and a second layer 20 including cyan microcapsules (C), and another separate layer 22 is interposed between the second layer 20 and a third layer 24 including yellow microcapsules (Y). A color correction dye 12 in the separate layer 18 is a green-light absorber whereas a color correction dye 26 in the separate layer 22 is a red-light absorber. In either FIG. 3 or FIG. 4, the one or more color correction dyes may also be present in the binder of at least one of the microcapsule layers.

In either of the latter two embodiments, the microcapsule layers, or the microcapsule layers and the one or more separate layers may be arranged in any order which is of utility to improve gray scale. However, in order to effectively reduce the film speed of a set of microcapsules without affecting the film speed of another set of microcapsules, a layer containing the microcapsules of which the film speed is intended to be reduced should be laid under a layer containing microcapsules of which the film speed is not intended to be reduced. At the same time, a color correction dye by which the film speed is intended to be reduced should be contained in the underlying microcapsule layer or in a separate layer which is interposed between the overlying and underlying microcapsule layers. In this sense, a layer containing a set of microcapsules of a fastest film speed, typically, is laid under a layer containing a set of microcapsules of a slower film speed.

The imaging material according to the foregoing embodiments can be prepared by adding the color correction dye(s) to a binder solution or solutions after the microcapsules are prepared and by applying the solution or solutions to a substrate to form the microcapsule layer(s) or the separate layer(s). Where the color correction dye(s) is added to a binder solution or solutions for forming the separate layer(s), this or these binder solutions may be applied to the substrate after one or more microcapsule layers are formed on the substrate. Stated differently, the color correction dye(s) can be incorporated into the imaging material even after the microcapsule layer(s) is formed on the substrate. Where two or more solutions are prepared to form the microcapsule layers, or the microcapsule layer(s) and the separate layer(s), the solutions may be applied in any order which results in any of the foregoing embodiments.

One of the preferred color correction dyes for use in the present invention includes a water soluble dye.

Preferred examples of water soluble dyes useful to reduce the film speed of magenta microcapsules are dyes with absorption peaks in the 550 nm region, which includes Eosin B, Eosin Y, Erythrosin B, Acid Fuchsin, Phloxine, Phloxine B, Rhodamine B, and Rose Bengal. In the above-mentioned examples, Erythrosin B is particularly preferred. Other water soluble dyes useful in association with magenta microcapsules include Acid Red 4, Acid Red 8, Acid Red 37, Acid Red 40, Acid Red 88, Acid Red 106, Acid Red 151, Basic Red 29, Congo Red, Cresol Red, Cresol Red Sodium Salt, D&C Red No. 33, Disperse Red 13, Ethidium Bromide, Mordant Red 19, and Neutral Red.

Water soluble dyes with absorption peaks in the 650 nm region, which are useful in association with cyan microcapsules include Acid Alizarian Violet N, Acid Blue 25, Acid Blue 29, Acid Blue 40, Acid Blue 41, Acid Blue 45, Acid Blue 80, Acid Blue 92, Acid Blue 120, Acid Blue 129, Acid Blue 161, Acid Violet 5, Acid Violet 7, Acid Violet 17, Alcian Blue GX, Alizarian Violet 3R, Aniline Blue, Aniline Blue W. S., Basic Blue 41, Basic Blue 47, Basic Blue 66, Basovit Blue 665 E, Brilliant Blue G, Brilliant Blue R, Brilliant Cresyl Blue, Bromophenol Blue, Celestine Blue, Chicago Sky Blue 6B, Coomassie Brilliant Blue G-250, Coomassie Brilliant Blue R-250, Direct Blue 71, Direct Violet 51, Disperse Blue 1, Disperse Blue 3, Disperse Blue 14, Eriochrome Blue Black B, Ethyl Violet, Evans Blue, Indigo Carmine, Luxol Fast Blue ARN, Meldola's Blue, Methyl Violet 3B, Mordant Blue 13, Naphthol Blue Black, Oxazine 4 Perchlorate, Oxazine 170 Perchlorate, Prussian Blue, Reactive Blue 2, Reactive Blue 4, Remazol Brilliant Blue R, Solar Blue RCLL Supra Powder, Trypan Blue, for reducing the film speed of cyan microcapsules include Basic Blue 3, Brilliant Cresyl Blue ALD, DOTC Iodide, HDITC Perchlorate, HITC Iodide, HITC Perchlorate, Luxol Fast Blue MBSN, Methylene blue, New Methylene Blue N, Nile Blue A, Oxazine 1 Perchlorate, Patent Blue VF, and Reactive Blue 15. GL.

Water soluble dyes useful to reduce the film speed of yellow microcapsules are dyes with absorption peaks in the 450 nm range. Examples of such yellow dyes include AAA Yellow Atlas 85, AAOA Yellow Solar Set, Acid Yellow 42, Acid Yellow 65, Acid Yellow 76, Brilliant Yellow, Bromothymol Blue Reagent ACS, Coumarin 102, DCM, Direct Yellow 62, Disperse Orange 1, Disperse Orange 11, Disperse Orange 13, Fast Blue B Salt, Fast Dark Blue R, Fast Yellow GC Salt, Fluorol Yellow 088, Flourescein, Mordant Yellow 10, Nitrazine Yellow, Palatine Fast Yellow BLN, Saffron, Thiazol Yellow G, Thymol Blue Reagent ACS, and Variamine Blue RT Salt. Preferred examples of water soluble yellow dyes include Acid Yellow 17, Acid Acid Yellow 40, Acridine Yellow G, Auramine 0, Basic Yellow 11, Cibacron Brilliant Yellow 3G-P, Direct Yellow 8, Direct Yellow 27, Direct Yellow 29, Direct Yellow 50, Disperse Orange 3, Disperse Yellow 3, Disperse Yellow 7, Disperse Yellow 9, Flavazin L, Fast Garnet GBC Base, Intraplast Yellow 3R, Naphthol Yellow S, Rosolic Acid, Thioflavin S, and Thioflavin T. Tartrazine is the most preferred yellow dye.

The aforementioned water soluble dyes are particularly useful where the binder in the microcapsule layer(s) or in the separate layer is a hydrophilic binder. Oil soluble dyes are also useful in the present invention where the binder is a hydrophobic binder.

The amount of the color correction dye is selected to produce the desired adjustment in gray scale. The amount can be easily calculated in the manner described hereinafter. First, a three-color test imaging sheet is prepared which includes cyan, magenta and yellow microcapsules coated thereon, and H and D curves (white light sensitometry) for three sets of microcapsules are plotted with respect to the test imaging sheet. Second, on the basis of the H and D curves, energy of light (i.e., loss in speed) is determined which is necessary for a dye to absorb in order to match or approximate the film speed(s) of slower microcapsules with that of faster microcapsules. The amount of dye can then be calculated from the determined loss in film speed on the basis of the following equation:

$$E = K C$$

where E is loss in film speed, K is a coefficient empirically determined from experiments, and C is the concentration of a dye.

One of the advantages of the invention is that for any two sets of microcapsules having different film speeds, the amount of the color correction dye can be calculated and added to faster set of microcapsules to produce better gray scale.

One of the preferred binders useful in the present invention is a hydrophilic binder which can be soluble in water with the water soluble dyes and can form a liquid coating composition or coating solution applicable to a suitable substrate. Hydrophobic binders can also be useful in the present invention as stated above. It is important that the binder(s) in which the color correction dye(s) is incorporated can dissolve the color correction dye(s) when being in the form of coating solution. Examples of hydrophilic binder include gelatin, polyvinyl alcohol, polyacrylamide, polyvinyl acetate, organosilanes (Dow Additive 25), and acrylic lattices.

The photosensitive material of the present invention can be used in conjunction with various light-sensitive materials and image-forming agents to produce images by different techniques.

For example, positive working photohardenable or negative working photosoftenable light sensitive compositions can be contained in the internal phase of the microcapsules. Photohardenable compositions such as photopolymerizable and photocrosslinkable materials increase in viscosity or solidify upon exposure and yield positive images. Photosoftenable compositions, such as some photodecomposable or photodepolymerizable materials, decrease in viscosity and result in negative images. Ethylenically unsaturated organic compounds are useful photohardenable materials. These compounds contain at least one terminal ethylene group per molecule. Typically, they are liquid. Polyethylenically unsaturated compounds having two or more terminal ethylene groups per molecule are preferred. All examples of this preferred subgroup are ethylenically unsaturated acid esters of polyhydric alcohols, such as trimethylol propane triacrylate (TMPTA) and dipentaerythritol hydroxypentaacrylate (DPHPA) (see U.S. patent application Ser. No. 420,632 filed Oct. 5, 1989).

Initiators useful in the present invention includes homolytic initiators which generate free radicals upon photochemical cleavage caused by visible light such as certain benzoin ethers and initiators which function via hydrogen abstraction. Preferred initiators are soluble in the light-sensitive composition. Xanthones, thioxanthones, polycyclic quinons, benzoin alkyl ethers are particularly useful. Specific examples of useful initiators are benzophenone, Michler's ketone, benzoin methyl ether, 2,2-dimethoxy-2-phenylacetophenone, isopropylthioxanthone, ethyl para-dimethylaminobenzoate, 3-cinnamoyl-7-diethylamino coumarins, etc. A potentially useful red initiator is N,N,N',N'-tetra-n-butylthionine; a potentially useful green initiator is N,N,N',N'-tetramethyl-4'-dodecylsafranine, and a potentially useful blue initiator is phenanthraquinone. Another initiator systems useful in a red or green light-sensitive microcapsule is described in U.S. Pat. No. 3,495,987. Most preferred photoinitiators for use in the present invention include ionic dye-counter ion compounds described in U.S. Pat. No. 4,772,541. A preferred class of ionic dye-counter ions is cationic dye borates and still more particularly cyanine dye-borates. Typically, the borate is a triphenylalkyl borate such as a triphenylbutyl borate. Other dye complexes such as Rose Bengal iodonium and Rose Bengal pyryllium complexes may also be used. It is also preferred to use disulfide with dye-borates (see U.S. patent application Ser. No. 321,257 filed Mar. 9, 1989). Silver halide systems described in U.S. Patent Nos. 4,772,531 and 4,767,690 is also useful in the present invention.

Various color precursors as well as other image-forming agents can be used in the present invention. Where color precursors are used, images can be formed by the interaction of color precursors and color developers of the type conventionally used in the carbonless paper art. Images can also be formed by the color producing interaction of a chelating agent and a metal salt or by the reaction of certain oxidation-reduction reaction pairs, many of which have been investigated for use in pressure-sensitive carbonless papers. Other useful image-forming agents include an oil soluble dye. Images can be formed by transfer the oil soluble dye to plain or treated paper. The internal phase of the microcapsules itself has its own image-forming capability. For example, it is known that toners used in the xerographic recording process selectively adhere to the image areas of an imaging sheet exposed and developed as in the present invention.

Furthermore, the image-forming agent can be provided inside the microcapsules, in the microcapsule wall, or outside the microcapsules in the same layer as the microcapsules or in a different layer. In all the cases, it is important that the image-forming agent is soluble in the internal phase of the microcapsules. In the latter two cases, the internal phase picks up the image-forming agent (e.g., by dissolution) upon being released from the microcapsules and carries it to the developer layer or an associated treated or untreated sheet. Also in all the aforementioned cases, it is preferred that the internal phase does not dissolve the color correction dye upon release. The color correction dye can otherwise be carried together with the image-forming agent and can affect a resultant image. Oil soluble image-forming agents and hydrophobic internal phase are therefore preferred where water soluble color correction dyes are employed.

Typical color precursors useful in the present invention includes electron donating type compounds. Representative examples of such color precursors include substantially colorless compounds having in their partial skeleton a lactone, a lactam, a sulfone, a spiropyran, an ester or amido structure such as triarylmethane compounds, bisphenylmethane compounds, xanthene compounds, fluorans, thiazine compounds, spiropyran compounds and the like. Preferred yellow color precursors are described in U.S. Pat. No. 4,908,447. Crystal Violet Lactone and Copikem X, IV, and XI (products of Hilton-Davis Chemical Co.) and Reakt Yellow (a product of BASF) are often used alone or in combination as color precursors in the present invention.

Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hyroxy group and formaldehyde, etc.; metal salts or aromatic carboxylic acids such as zinc salicylate, tin salicylate, zinc-2-hydroxynaphthoate, zinc-3,5-di-tert-butyl salicylate, oil soluble metal salts or phenol-formaldehyde novolak resins (e.g., see U.S. Pat. Nos. 3,672,935; 3,732,120; and 3,737,410) such as zinc modified oil soluble phenol-formaldehyde resins as disclosed in U.S. Pat. No. 3,732,120, zinc carbonate etc. and mixture thereof. A preferred class of glossable developer is designed in commonly assigned U.S. Pat. No. 4,859,561.

The most common support for imaging sheet in accordance with the present invention is transparent film or paper. The paper may be a commercial impact raw stock, or special grade paper such as cast-coated paper or chrome-rolled paper. The latter two papers are preferred when using microcapsules having a diameter between approximately 1 and 5 microns because the surface of these papers is smoother and therefore the microcapsules are not easily embedded in the stock fibers. Transparent supports such as polyethylene terephthalate (PET) or translucent support can also be used in the present invention. Another preferred support for the microcapsules is aluminized PET as described in U.S. Pat. No. 4,910,117.

It has been found that a uniform re-exposure or a co-exposure can be used to improve the sensitivity of the imaging sheet by generating radicals which react with the oxygen present in the microcapsules to prevent it from inhibiting the imaging photochemistry during the imaging exposure. The details are described in U.S. Pat. No. 4,482,624. This technique is also useful in the present invention.

The microcapsules used in the present invention can be produced using known encapsulation techniques including coacervation, interfacial polymerization, polymerization of one or more monomers in an oil, etc. Representative examples of suitable wall-formers are gelatin materials (see U.S. Pat. Nos. 2,370,456 and 2,800,457 to Green et al.) including gum arabic, polyvinyl alcohol, carboxy-methyl-cellulose; resorcinol-formaldehyde wall formers (see U.S. Pat. No. 3,775,190 to Hart et al.); isocyanate wall-formers (see U.S. Pat. No. 3,914,511 to Vassiliades); isocyanatepolyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376; and 4,089,802 to Forris et al.); and melamine-formaldehyde resin and hydroxypropyl cellulose (see commonly assigned U.S. Pat. No. 4,025,455 to Shackle). Melamine-formaldehyde capsules are particularly preferred (see U.S. Pat. No. 4,608,330 and U.S. patent application Ser. No. 370,103 filed Jun. 22, 1989 (allowed)). The mean microcapsule size used in the present invention generally ranges from about 1 to 25 microns.

The imaging sheets of the present invention can be constituted such that they are sensitive to visible light. The exposure alone may cause a sufficient change in viscosity of the internal phase to control imaging. Otherwise, exposure can be used to initiate or advance the photochemistry in the exposed areas and a subsequent heat treatment can be used to enhance the image.

The present invention is further illustrated by the following non-limiting examples.

EXAMPLE 1

Melamine-Formaldehyde Prepolymer Preparation

1. Into 5 gallon reactor, 7,300 g water is added.
2. While mixing at 550 rpm, 710 g melamine and 1,374 g formaldehyde are added to the reactor.
3. The pH is adjusted to 8.5 using 5% $Na_2CO_3$.
4. The preparation is heated to 65° C. and is held for one and a half hour during which melamine-formaldehyde prepolymer is prepared.

Capsule Preparation

1. Into a 38 liter stainless steel vessel, 17,200 g water, 320 g sodium polystyrene, 506 g pectin, 9.6 g $NaHCO_3$, and 343 g melamine are weighed. The vessel is stirred at 3,450 rpm for two hours.
2. The pH is adjusted to 6.0 using a 20% solution of NaOH.
3. The preparation (continuous phase components) are then added to a 10 gallon emulsification vessel and mixed at 4,320 rpm.
4. The internal phase is added over a period of 1 minute. Emulsification is continued for 20-40 minutes.
5. After the desired particle size (4-10 microns) has been achieved, the emulsion is pumped to a reactor and is heated to 60° C. When 60° C. is reached, the melamine-formaldehyde prepolymer prepared as described above is added.
6. The pH is stabilized for 5-15 minutes and is then adjusted to 6.0 using 5 to 20% phosphoric acid.
7. The preparation is heated to 70° C. and is held for a one hour cure time during which the capsule walls are formed.
8. 1,700 g of a 50% urea solution is added, and the preparation is continued to be heated for another 40 minutes.
9. 300 g of 20% sodium hydride is added and then the capsule preparation is cooled to 25° C.

Three batches of microcapsules were prepared as above for use in a full color imaging sheet using the three internal phase compositions set forth below.

| Internal Phase A (460 nm) | |
|---|---|
| TMPTA | 6,000 g |
| Reakt Yellow (BASF) | 720 g |
| 7-diethylamino-3-cinnamoyl coumarin | 32 g |
| DIDMA | 60 g |
| N-100 (Desmodure Polyisocyanate Resins) | 400 g |
| Internal Phase B (550 nm) | |
| TMPTA | 4,800 g |
| DPHPA | 1,200 g |
| Copikem Mead Magenta (Hilton Davis Chemical Co.) | 1,440 g |
| 1,1'-di-N-heptyl-3,3-3'-3'-tetramethylindocarbocyanine triphenylbutylborate | 48 g |
| DIDMA | 40 g |
| N-100 | 400 g |
| 4-nitro-benzyl-alcohol | 40 g |
| Internal Phase C (650 nm) | |
| TMPTA | 4,200 g |
| DPHPA | 1,800 g |
| Copikem Mead Cyan (Hilton Davis Chemical Co.) | 720 g |
| 1,1'-di-N-heptyl-3,3-3'-3'-tetramethylindodicarbocyanine triphenylbutylborate | 100 g |
| DIDMA | 60 g |
| N-100 | 400 g |

Each of the above internal phase compositions was a composition having been prepared in accordance with the steps described below.

Internal Phase Preparation

1. TMPTA and DPHPA are added to 5 gallon vessel, and are mixed at 350 rpm.
2. The mixture is heated to 90° C. to 105° C.
3. The color former is added to the mixture, and is held until dissolved.
4. the preparation is cooled to 50° C. (90° C. for Internal Phase A).
5. The photoinitiator is added to the preparation, and is mixed until dissolved.
6. DIDMA is added to the preparation, and is mixed at 50° C. (90° C. for Internal Phase A) for 5 minutes.
7. 4-nitro-benzyl-alcohol is added, and is mixed for 5 minutes for Internal Phase B.
8. N-100 is added, and is mixed for 5 minutes.
9. The internal phase composition is ready to add to the emulsification vessel.

Internal Phase A provides a yellow image-forming agent and is sensitive at 460 nm. Internal Phase B provides a magenta image-forming agent and is sensitive at 550 nm, and Internal Phase C contains a cyan image-forming agent and is sensitive at 650 nm.

Full Color Coating Preparation

1. Into a 30 liter vessel, 4,014.1 g cyan microcapsule solution (one of the three batches of microcapsules containing Internal Phase C), 2,221.1 g magenta microcapsule solution (the batch of microcapsules containing Internal Phase B), and 3,818.4 g yellow microcapsule solution (the batch of microcapsules containing Internal Phase A) are added, and the vessel is stirred.

2. 648 g Dow Additive 25 (binder), Triton X-100 (surfactant), and 474.9 g Vinol 205 (binder) are added to the preparation, and are mixed.

3. 1,280 g of 1% Rose Bengal (green light absorber) is added to the mixture, and is mixed.

4. 3,543.5 g water is added to dilute the mixture to a 18% (solid content) coating solution.

5. The resultant coating solution is mixed thoroughly for one hour.

6. The coating solution was coated on an aluminized PET film, and then the coating is dried to provide a full color imaging sheet.

Figure 5:
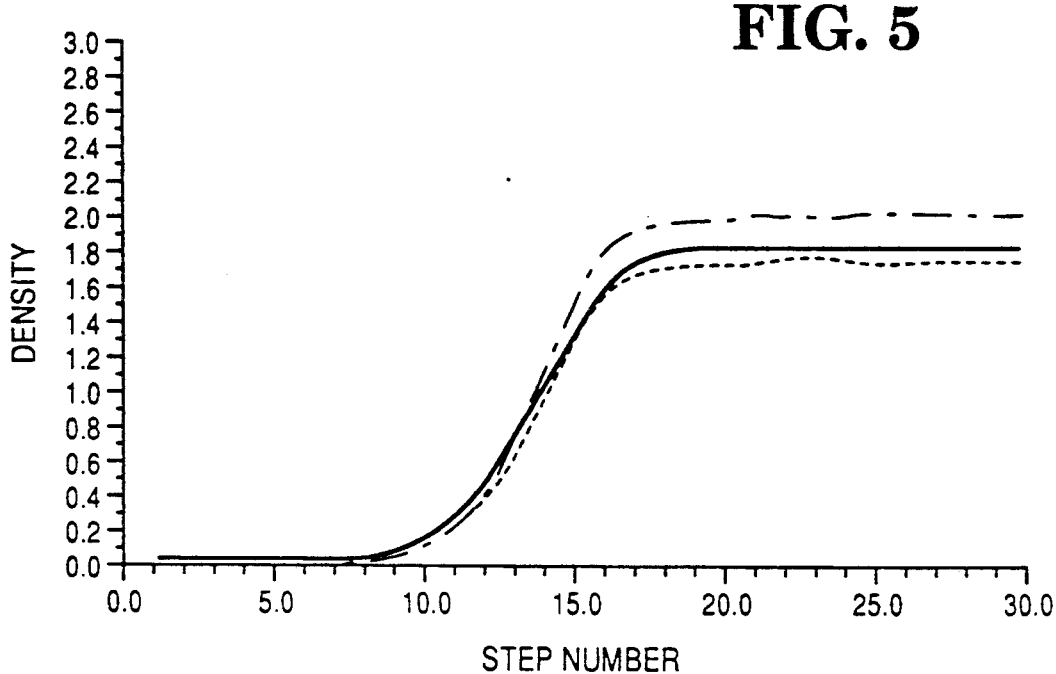
FIG. 5 illustrates H and D curves (Equivalent Neutral Density curves) for yellow, magenta and cyan microcapsules used in an imaging sheet in accordance with the present invention.

The film speed of the prepared imaging sheet was measure The light used was broad band white light (54,111.8 lm/m$^2$). The densitometer used was a X-Rite 404 with an optic head status A (a product of X-Rite Incorporated). The exhibited H and D curves (Equivalent Neutral Density curves) for the three batches of microcapsules are shown in FIG. 5 wherein a H and D curve for the yellow microcapsules is represented by the dot-and-dash line, a H and D curve for the magenta microcapsules is represented by the broken line, and a H and D curve for the cyan microcapsules is represented by the solid line.

COMPARATIVE EXAMPLE

A microcapsule coating solution was prepared in a similar manner to that in Example 1 except that Rose Bengal was not added. A full color imaging sheet was prepared from this coating solution in the same manner as in Example 1, and the film speed was measured. The light and the densitometer used for measuring the film speed are the same as in Example 1.

Figure 6:
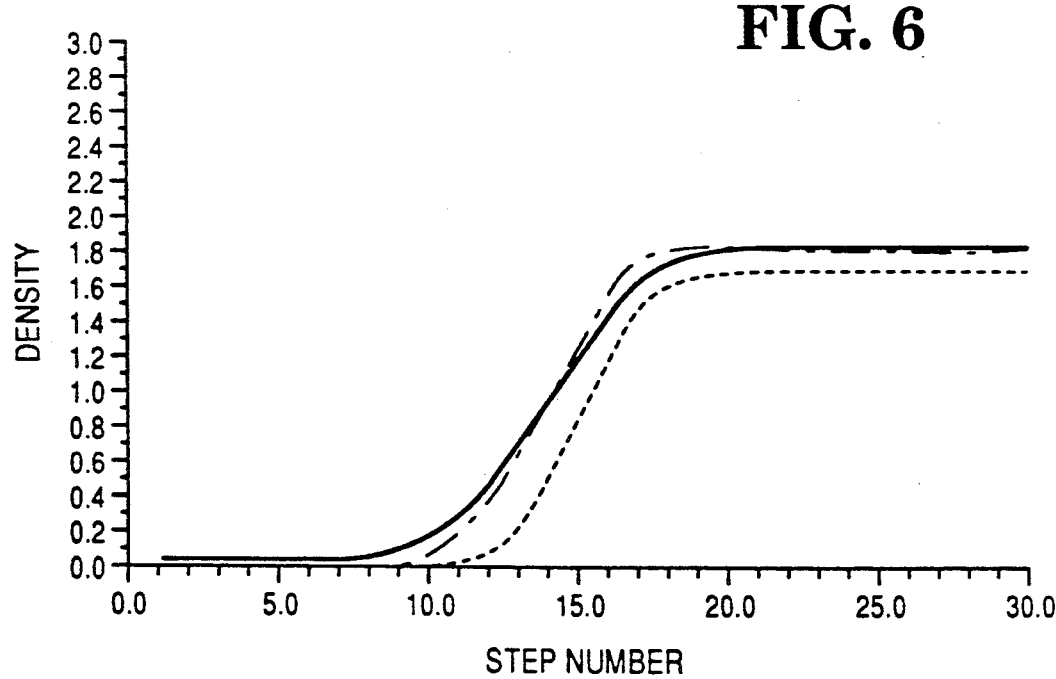
FIG. 6 illustrates H and D curves (Equivalent Neutral Density curves) for yellow, magenta and cyan microcapsules used in an imaging sheet prepared without any color correction dye.

The exhibited H and D curves (Equivalent Neutral Density curves) for the three batches of microcapsules are shown in FIG. 6 where H and D curves for the yellow, magenta and cyan microcapsules are represented by the dot-and-dash, broken, and sold lines, respectively.

As can be seen by comparing FIGS. 5 and 6, addition of Rose Bengal approximates the H and D curves for the three batches of microcapsules.

Having described the invention in detail and by reference to the preferred embodiments thereof, it will be apparent that modifications and variations are possible without departing from the scope of the invention defined in the appended claims.

What is claimed is:

1. A photosensitive material comprising a support having microcapsules and a color correction dye on a surface thereof, said microcapsules including a first set of microcapsules sensitive to red light and associated with a cyan image-forming agent, a second set of microcapsules sensitive to green light and associated with a magenta image-forming agent, and a third set of microcapsules sensitive to blue light and associated with a yellow image-forming agent, each of said first, second and third sets of microcapsules containing an internal phase, said first, second and third sets of microcapsules being present in one or more layers containing a binder on said surface of said support, said cyan, magenta and yellow image-forming agents being respectively soluble in said internal phases of said first, second and third sets of microcapsules, said color correction dye being insoluble in said internal phase and absorbing at least one of red, green, and blue light, said color correction dye being present in said binder of said one or more layers of microcapsules or being present in a separate layer containing a binder such that the film speed of at least one of said first, second and third sets of microcapsules is reduced whereby said photosensitive material exhibits improved gray scale.

2. The photosensitive material of claim 1 wherein said first, second and third sets of microcapsules are present in one layer containing a binder and said color correction dye.

3. The photosensitive material of claim 2 wherein said binder of said one layer of microcapsules is a hydrophilic binder, and said color correction dye is a water soluble dye and is present in said binder of said one layer of microcapsules.

4. The photosensitive material of claim 3 wherein said internal phase of said first set of microcapsules contains a first photohardenable composition, said internal phase of said second set of microcapsules contains a second photohardenable composition, and said internal phase of said third set of microcapsules contains a third photohardenable composition.

5. The photosensitive material of claim 4 wherein said cyan image-forming agent is a cyan color precursor, said magenta image-forming agent is a magenta color precursor, and said yellow image-forming agent is a yellow color precursor, said cyan, magenta and yellow color precursors being substantially colorless and being capable of turning colored upon contact with a developer material present on said support or a separate support.

6. The photosensitive material of claim 1 wherein said color correction dye absorbs said at least one of red, green, and blue light so as to allow said first, second and third sets of microcapsules to exhibit more closely approximate film speeds upon exposure to a light source which generates broad band white light.

7. The photosensitive material of claim 1 wherein said first, second and third sets of microcapsules are present in at least two layers, each of said layers containing a binder, and said color correction dye is present in said binder of at least one of said layers of microcapsules or in said separate layer, said separate layer being interposed between two of said layers of microcapsules.

8. The photosensitive material of claim 7 wherein said binder of said at least one of said layers microcapsules is a hydrophilic binder, and said color correction dye is a water soluble dye and is present in said binder of said at least one of said layers of microcapsules.

9. The photosensitive material of claim 8 wherein said internal phase of said first set of microcapsules contains a first photohardenable composition, said internal phase of said second set of microcapsules contains a second photohardenable composition, and said internal phase of said third set of microcapsules contains a third photohardenable composition.

10. The photosensitive material of claim 9 wherein said cyan image-forming agent is a cyan color precursor, said magenta image-forming agent is a magenta color precursor, and said yellow image-forming agent is a yellow color precursor, said cyan, magenta and yellow color precursors being substantially colorless and being capable of turning colored upon contact with a developer material present on said support or on a separate support.

11. The photosensitive material of claim 7 wherein said separate layer is formed of a hydrophilic composition, and said color correction dye is a water soluble dye and is present in said separate layer.

12. The photosensitive material of claim 11 wherein said internal phase of said first set of microcapsules contains a first photohardenable composition, said internal phase of said second set of microcapsules contains a second photohardenable composition, and said internal phase of said third set of microcapsules contains a third photohardenable composition.

13. The photosensitive material of claim 12 wherein said cyan image-forming agent is a cyan color precursor, said magenta image-forming agent is a magenta color precursor, and said yellow image-forming agent is a yellow color precursor, said cyan, magenta and yellow color precursors being substantially colorless and being capable of turning colored upon contact with a developer material present on said support or on a separate support.

14. A method of controlling the film speed of a photosensitive material employing a support having microcapsules on a surface thereof, said microcapsules including first, second and third sets of microcapsules, each set of microcapsules containing an internal phase, said first set of microcapsules being sensitive to red light and being associated with a cyan image-forming agent, said second set of microcapsules being sensitive to green light and being associated with a magenta image-forming agent, said third set of microcapsules being sensitive to blue light and being associated with a yellow image-forming agent, said first, second and third sets of microcapsules being present in one or more layers on said surface of said support, said cyan, magenta and yellow image-forming agents being respectively soluble in said internal phases of said first, second and third sets of microcapsules, which comprises:

preparing one or more coating compositions in which said first, second and third sets of microcapsules are dispersed;

adding a color correction dye to at least one of said one or more coating compositions or a separate coating composition, said color correction dye being insoluble in said internal phase, said color correction dye absorbing at least one of red, green, and blue light such that the film speed of at least one of said first, second and third sets of microcapsules is reduced to allow said photosensitive material to exhibit improved gray scale; and applying said one or more coating compositions, or said one or more coating compositions and said separate coating composition to said support to form said one or more layers of microcapsules.

15. The method of claim 14 wherein said preparation of said one or more coating compositions comprises preparing one coating composition containing said color correction dye in which said first, second and third sets of microcapsules are dispersed.

16. The method of claim 15 wherein said one coating composition is an aqueous composition, and said color correction dye is a water soluble dye and is added to said one coating composition.

17. The method claim 14 wherein said preparation of said one or more coating compositions comprises preparing at least two coating compositions in which said first, second and third sets of microcapsules are dispersed, said color correction dye is added to at least one of said coating compositions or said separate coating composition, said coating compositions, or said coating compositions and said separate coating composition are applied to said support in any order which enhances gray scale and film speed.

18. The method of claim 17 wherein said at least one of said coating compositions is an aqueous composition, and said color correction dye is a water soluble dye and is added to said aqueous coating composition.

19. The method of claim 17 wherein said separate coating composition is an aqueous composition, and said color correction dye is a water soluble dye and is added to said separate coating composition.

20. The method of claim 14 wherein said color correction dye is added in an amount which allows said first, second and third sets of microcapsules to exhibit more closely approximate film speeds upon exposure to light source which generates broad band white light.

* * * * *